United States Patent [19]
Yuan

[11] Patent Number: 6,028,336
[45] Date of Patent: Feb. 22, 2000

[54] TRIPLE POLYSILICON FLASH EEPROM ARRAYS HAVING A SEPARATE ERASE GATE FOR EACH ROW OF FLOATING GATES, AND METHODS OF MANUFACTURING SUCH ARRAYS

[75] Inventor: Jack H. Yuan, Cupertino, Calif.

[73] Assignee: SanDisk Corporation, Sunnyvale, Calif.

[21] Appl. No.: 08/908,264

[22] Filed: Aug. 7, 1997

Related U.S. Application Data

[62] Division of application No. 08/550,887, Oct. 31, 1995, Pat. No. 5,712,179.

[51] Int. Cl.[7] .................................................. H01L 29/788
[52] U.S. Cl. .......................................... 257/315; 257/319
[58] Field of Search .................................... 257/315, 319, 257/320, 321, 322

[56] References Cited

U.S. PATENT DOCUMENTS

| | | |
|---|---|---|
| 5,070,032 | 12/1991 | Yuan et al. . |
| 5,095,344 | 3/1992 | Harari . |
| 5,343,063 | 8/1994 | Yuan et al. . |
| 5,354,702 | 10/1994 | Arima et al. . |
| 5,534,456 | 7/1996 | Yuan et al. . |
| 5,739,567 | 4/1998 | Wong ........................................ 257/316 |

*Primary Examiner*—Sara Crane
*Attorney, Agent, or Firm*—Majestic, Parsons, Siebert & Hsue

[57] ABSTRACT

As part of a flash EEPROM array on a semiconductor substrate, erase gates are formed in individual trenches between rows of floating gates. The erase gate is positioned along one sidewall of the trench in a manner to be capacitively coupled with the floating gates of one of the rows adjacent the trench but spaced apart from the floating gates of the other row adjacent the trench. In this way, a separate erase gate is provided for each row of floating gates without increasing the size of the array. The erasure of each row can then be individually controlled. Two self-aligned methods of forming such an array are disclosed. One method involves forming a thick insulating layer along one sidewall of the trench and then filling a remaining space adjacent an opposite trench sidewall with polysilicon material forming an erase gate for the row of floating gates adjacent the other sidewall. A second method involves anisotropically etching a layer of polysilicon that is formed over the array in a manner to conform to the trench sidewalls, thereby separating the polysilicon layer into individual erase gates carried by the trench sidewalls.

3 Claims, 4 Drawing Sheets

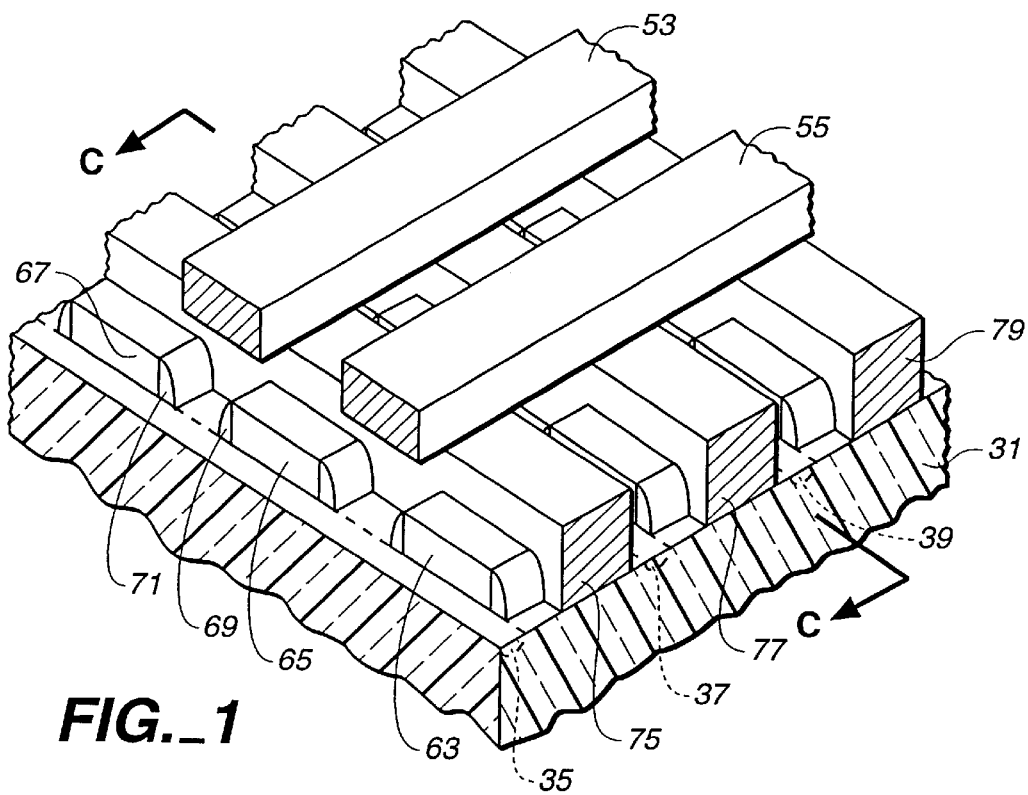
FIG._1
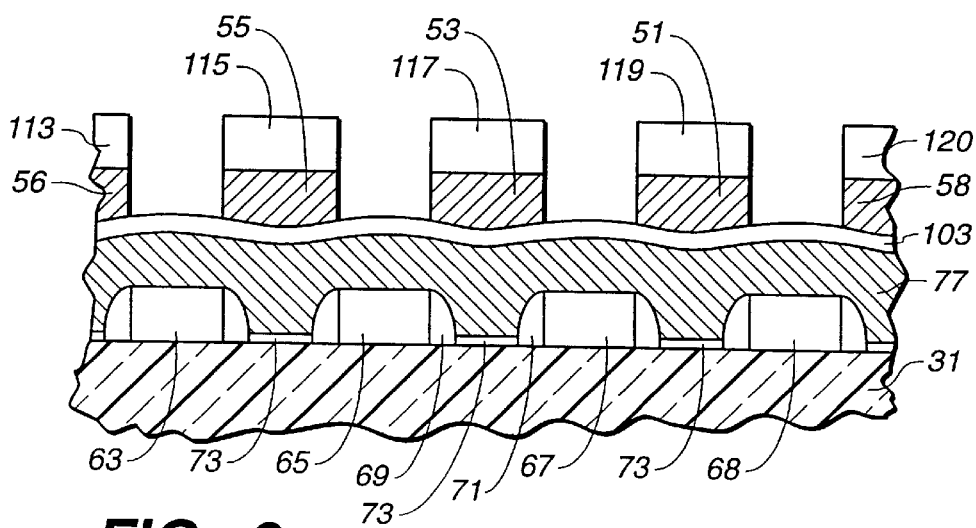
FIG._2

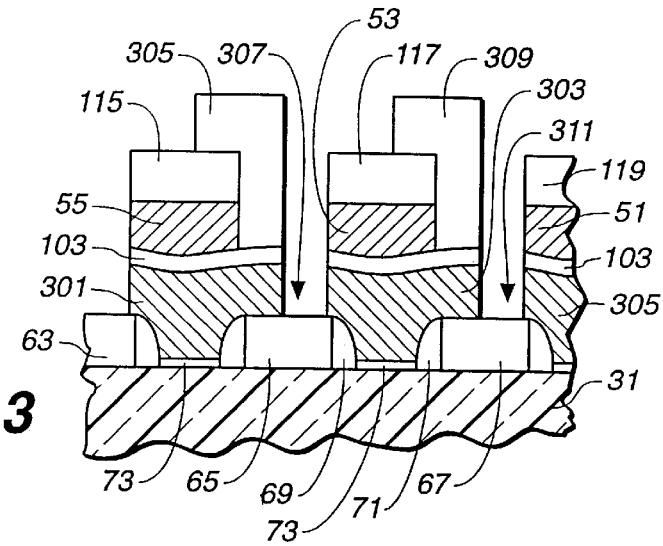
FIG._3
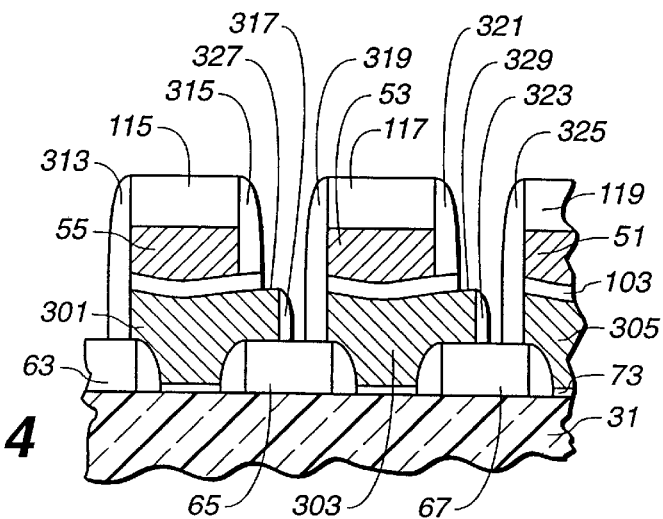
FIG._4
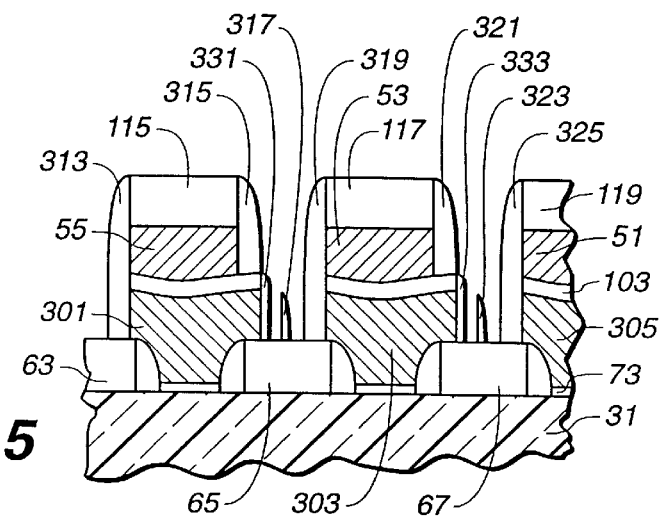
FIG._5

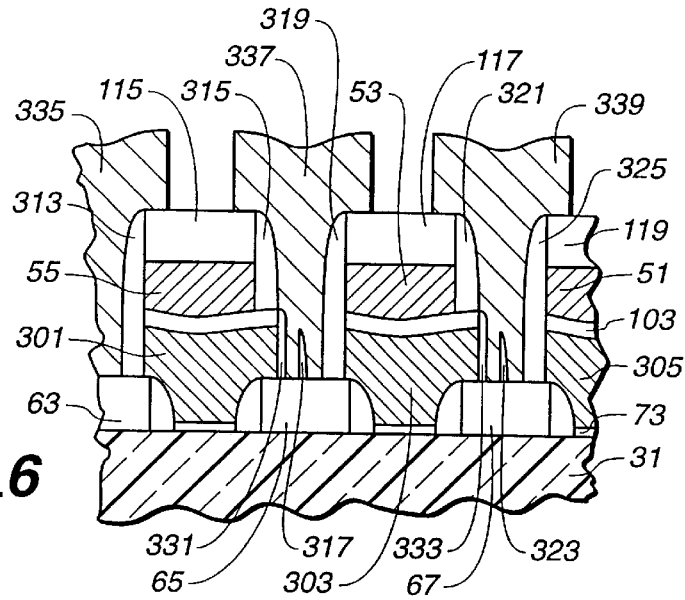
FIG._6
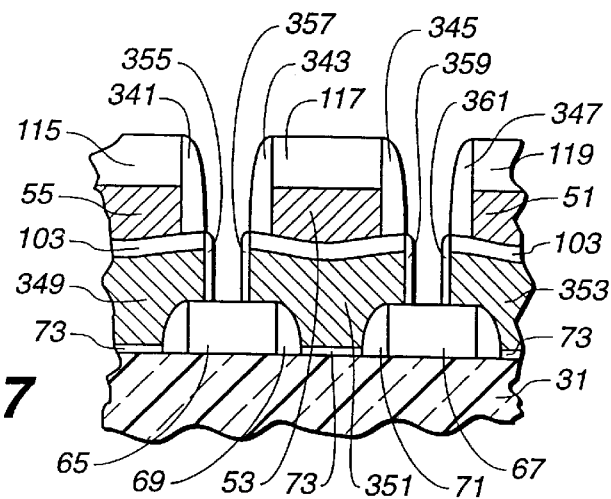
FIG._7
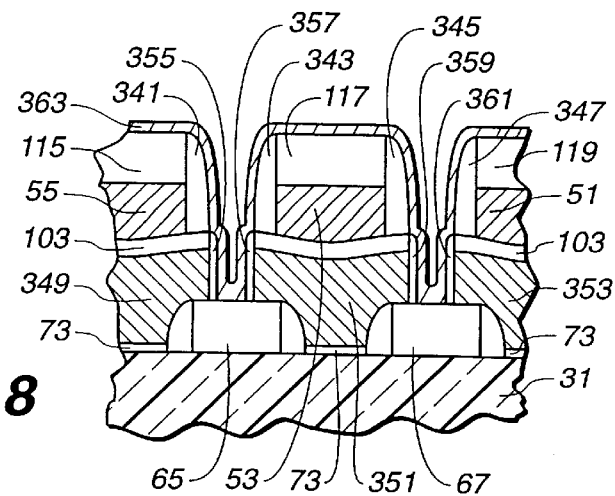
FIG._8

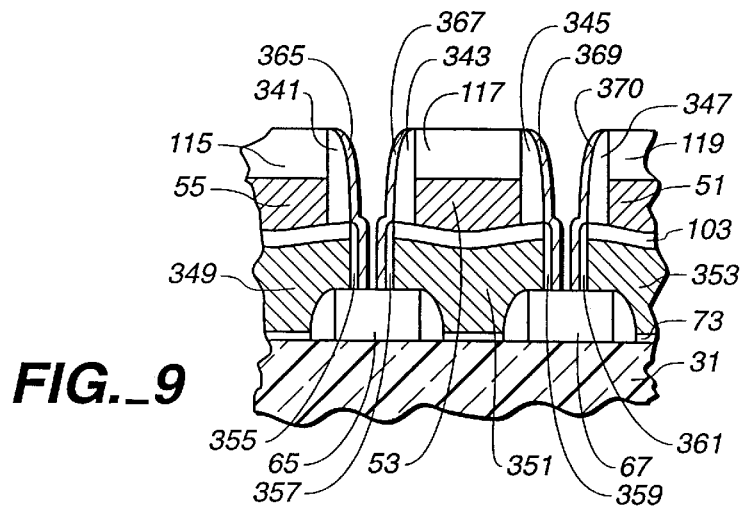
FIG._9
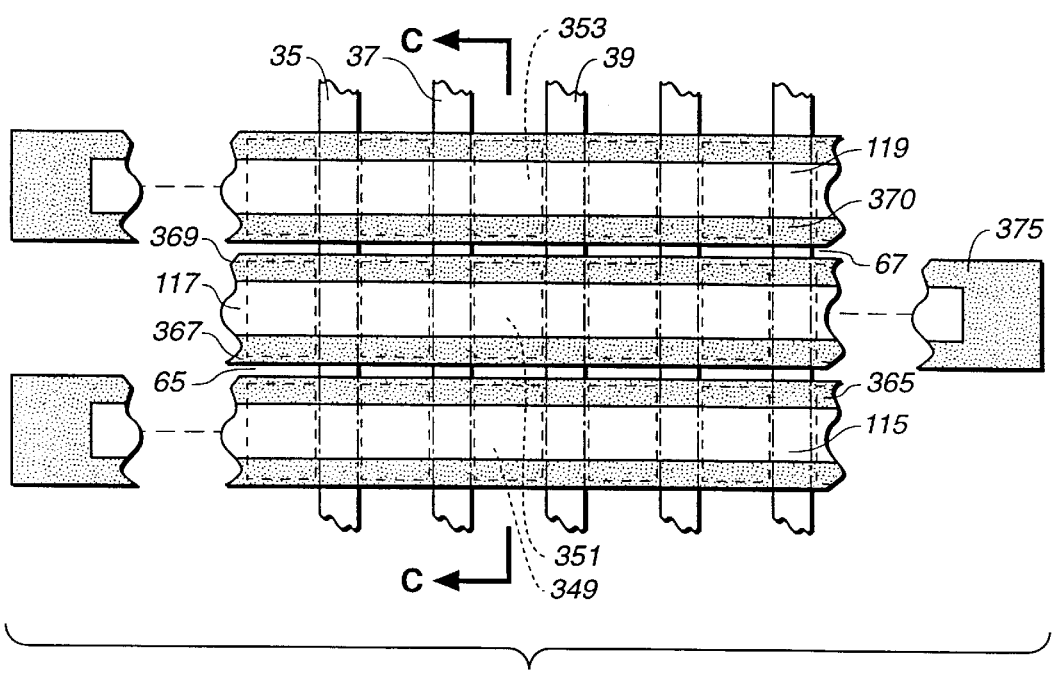
FIG._10

TRIPLE POLYSILICON FLASH EEPROM ARRAYS HAVING A SEPARATE ERASE GATE FOR EACH ROW OF FLOATING GATES, AND METHODS OF MANUFACTURING SUCH ARRAYS

This is a division of application Ser. No. 08/550,887, filed Oct. 31, 1995, U.S. Pat. No. 5,712,179.

BACKGROUND OF THE INVENTION

This invention relates generally to arrays of non-volatile memory cells which each includes a field effect transistor with a floating gate, and, more specifically, to EEPROM and flash EEPROM arrays and processes of forming them.

Field effect transistors having floating (unconnected) gates have long been utilized to form a non-volatile, semiconductor memory. Electrons are moved onto or removed from the floating gate of a given transistor memory cell in order to program or erase its state. The state of such a transistor memory cell is determined by applying a voltage across its source and drain and then measuring the current which passes through the transistor. The programmed level of charge on the floating gate is retained for a long period of time, essentially indefinitely. Memory arrays of such transistor cells are commonly available in various forms, such as PROMs, EPROMS, EEPROMs and flash EEPROMs. Currently, flash EEPROM technology is being used for large capacity semiconductor non-volatile memory, either in place of, or in combination with, a magnetic disk drive memory system.

Typically, such a semiconductor memory system is made up of a number of integrated circuit chips that each contain a two dimensional array of EEPROM cells, plus other integrated circuit chips providing a controller and other system operating support. One type of memory array integrated circuit chip includes elongated, spaced apart source and drain regions formed in a surface of a semiconductor substrate. These source and drain regions form the bit lines of the memory. A two dimensional array of floating gates has each floating gate positioned in a channel region between adjacent source and drain regions. An elongated control gate is positioned over each row of floating gates in a direction transverse to the source and drain regions. The control gates are the word lines of the memory array.

One type of cell used in such a memory array extends each of its floating gates over only part of its channel between the source and drain regions, while the control gate is positioned over the remaining portion of the channel. This is termed a "split-channel" type of EEPROM cell and effectively connects a select transistor in series with the floating gate transistor in order to isolate the floating gate transistor from the bit lines when its control gate (word line) is not active. An alternative type of EEPROM cell extends its control gate completely across the channel region, thus eliminating the select transistor and allowing the memory cell to be made smaller. However, the absence of the select transistor in each cell places additional constraints on operating a memory array of such cells.

One class of EEPROM devices employs an erase gate positioned adjacent the floating gate of each cell, with a thin dielectric therebetween, in order to transfer electrons from the floating gate to the erase gate when all the relative voltages are appropriately set. Flash EEPROM systems use a common erase gate for a sector or other block of cells, thus enabling their simultaneous erasure in a "flash." An alternative class of EEPROM devices does not use the separate erase gate, but rather removes the electrons from the floating gate through the substrate when all the appropriate voltages are set. In such flash EEPROM systems, the sectors or other blocks of cells are isolated from one another on the substrate in order that the individual blocks may be selectively and individually erased.

Since a high density memory cell array is always desired, self-aligned techniques are used during manufacture of the circuit whenever possible. One way of forming an array with erase gates is to deposit the erase gates in between adjacent rows of memory cells that have already been largely formed, and to couple each erase gate with the floating gates of the adjacent rows on both sides. Such a structure is usually operated by erasing each pair of adjacent rows of cells together. This works well so long as an even number of two or more rows of memory cells are included in the individual sectors or other blocks of cells that are erased together. But recent semiconductor processes have resulted in the density of memory cells increasing to the point where a number of cells required for common sector sizes can be provided in one row cells, or even by one-half a row or less.

There is, however, an innovative way of operating such a memory array to erase only one of the adjacent rows at a time. As described in a copending patent application of Samachisa et al., Ser. No. 08/453,124, filed May 31, 1995, application of different voltages to the control gates of the rows on opposite sides of an erase gate allows a selected one of the two rows to be erased at a time. But it still can be desirable to provide each row with its own erase gate.

Therefore, it is a primary object of the present invention to provide memory cell array structures that have a separate erase gate for each of the rows of memory cells without having to sacrifice a high cell density.

It is another primary object of the present invention to provide improved techniques for making such arrays.

SUMMARY OF THE INVENTION

These and additional objects are obtained by the present invention, wherein, briefly and generally, individual elongated erase gates are formed immediately alongside the rows of cells which they erase, being separated a greater distance from an immediately adjacent row of cells. This is accomplished without significantly increasing the size of the memory cells or the spaces between the rows of cells. Each erase gate is self aligned with the edge of the row to which it is coupled in a manner to remain spaced apart from an adjacent row.

According to one specific aspect of the present invention, a trench between adjacent rows of cells is partially covered by mask strips positioned along one edge of each row, thus leaving open the trench adjacent the opposite edges of the rows. The open part of the trench is then filled with a conductive material such as doped polysilicon. This forms the erase gate for the row against which it is adjacent, and the mask strips keep the erase gate spaced apart from the adjacent row. The alignment of the mask strips between the rows is not as critical as other alignments during processing, since a variation in the thickness of those strips between the erase gates and their adjacent rows can be tolerated. The erase gate is self-aligned with the row to which it is coupled, the more critical spatial relationship.

According to another specific aspect of the present invention, a layer of conductive material is deposited over the irregular surface of an array of floating gates with control gates positioned thereover, including into the trenches between the rows. This layer is then anisotropically etched, after which portions of the layer on the sidewalls of the rows remain as electrically separate elongated erase gates. Each row then has an erase gate on each of its sides that is not shared by any other row.

Additional objects, advantages and features of the various aspects of the present invention can be had from the following description of their preferred embodiments, which description should be taken in conjunction with the accompanying drawings.

BRIEF DESCRIPTION OF THE DRAWINGS

FIG. 1 is a simplified perspective view of an intermediate structure of a flash EEPROM array that is formed in the course of manufacturing a complete memory array;

FIG. 2 is a cross-sectional view of the structure of FIG. 1, taken at section C—C thereof;

FIGS. 3–6 illustrate, in cross-sectional views, successive processing steps that turn the intermediate structure of FIGS. 1 and 2 into a completed memory array, according to a first embodiment of the present invention;

FIGS. 7–9 illustrate, in cross-sectional views, successive processing steps that turn the intermediate structure of FIGS. 1 and 2 into a completed memory array, according to a second embodiment of the present invention; and FIG. 10 is a plan view of the structure of FIG. 9, wherein FIG. 9 is a cross-sectional view of the structure of FIG. 10, taken at section C—C thereof.

DESCRIPTION OF THE PREFERRED EMBODIMENTS

The initial process steps in each of the first and second embodiments of the present invention are common with those described in detail in an earlier patent application of Yuan et al., Ser. No. 08/248,735, filed May 25, 1994, which is incorporated herein by this reference. FIG. 1 herein shows the major components of a partially completed memory structure that corresponds to that of FIGS. 12A–C of the earlier application but prior to the formation of the spacers 121 and 123 thereof. A sectional view of FIG. 2 herein corresponds to FIG. 12C of the earlier application without these spacers. Elements of the first and second embodiments herein that correspond to those of FIGS. 6–12 of the earlier application are given the same reference numbers.

Since the processing steps leading to the intermediate structures of FIGS. 1 and 2 herein are described in detail with respect to FIGS. 6–12 of the earlier application, they will not be repeated here. However, as background to the following description of the first and second embodiments herein, the structure of FIGS. 1 and 2 herein will first be briefly described. The structure is formed on a semiconductor substrate 31. Elongated, parallel source and drain regions 35, 37, and 39 are implanted into a surface of the substrate 31. Field oxide portions 63, 65 and 67, with oxide spacers (such as spacers 69 and 71) along their side walls, have strips 75, 77 and 79 of doped polysilicon extending across them. These polysilicon strips are later separated into separate floating gates. Doped polysilicon strips 53 and 55, arranged orthogonally with the polysilicon strips 75, 77 and 79, and also with elongated source and drain regions 35, 37 and 19, serve as control gates.

The perspective view of FIG. 1 omits various dielectric layers, for simplicity, but these are shown in its cross-sectional view of FIG. 2. A gate oxide layer 73 separates the resulting floating gates from their respective memory cell channel portions of the substrate 31. Another dielectric layer 103 separates the control gates from the floating gates to be formed. Oxide strips 113, 115, 117, 119 and 120 are positioned to cover top surfaces of respective control gates 56, 55, 53, 51 and 58. As described in the earlier application, the control gates and oxide strips covering them are shaped by a common etching step. It is this structure of FIGS. 1 and 2 that each of the first and second embodiments herein begin.

First Embodiment

The process of the first embodiment herein, and the resulting memory cell array structure, are discussed with respect to FIGS. 3–6. The further process forms erase gates that are self-aligned with other elements of the structure but which individually couple with only one of the rows of memory cells on opposite sides thereof.

FIG. 3 shows another intermediate structure that results after several additional processing steps are performed on the structure of FIGS. 1 and 2. Temporary masking strips (such as 305 and 309) are formed along one side of each of the control gate strips (such as 55 and 53). The masking strips are preferably formed by depositing a layer of photoresist material over the structure, exposing it to optical radiation through a mask and then dissolving portions to leave the desired masking strips behind, all in accordance with well known standard techniques. Portions of the bottom polysilicon strips are then separated into individual floating gates by etching through a mask formed by these photoresist strips and the top oxide strips 115, 117 and 119. The polysilicon strip 77 is shown in FIG. 3 to have been separated into floating gates 301, 303 and 305, with spaces 307 and 311 therebetween. The field oxide 65 and 67 protects the substrate from inadvertently being etched at the same time.

The intermediate structure of FIG. 4 illustrates further additional processing steps. After separating the first (bottom) polysilicon strips into individual floating gates, the photoresist masking strips 305 and 309 are removed by a standard process. A next step is to form dielectric spacers along the side walls in the spaces between the rows. To do so, a layer of oxide about 1500 Angstroms thick is first deposited by a chemical vapor deposition (CVD) process over the array in a manner to completely fill the spaces between the rows. This thick oxide layer is then anisotropically etched until substantially all of it is removed from horizontal surfaces. What remains are dielectric spacers 315, 317 and 319 along sidewalls in the spaces between two adjacent rows of floating gates, and the same between all other rows. The spacer 315 extends over only a portion of the floating gate 301 that extends into the space between the rows, leaving a top floating gate surface 327 exposed. The spacer 317 is formed along the vertical edge of the floating gate 301. The spacer 319 is formed on an opposite sidewall, extending a full distance from a top of the oxide strip 117 to the field oxide 65. The spacers 315 and 319 serve to insulate and physically separate both of the control gates 55 and 53, and the floating gate 303, from the erase gate strip that will be later formed in the remaining space between the rows.

Before forming the erase gates, surfaces of the portions of the floating gates extending into the spaces between the rows are prepared. If the spacer 317 alongside the floating gate 301 could be removed without affecting the spacers 315 and 319, which are desired to remain in place, a tunnel dielectric layer could be formed on the exposed polysilicon edge. But there is no practical way of doing so. Alternatively, the tunnel dielectric layer could be formed on the exposed horizontal surface 327 of the floating gate 301. But this floating gate area may be too small and hard to control. Therefore, as shown in FIG. 5, a portion of the floating gate edges are removed by etching, using a mask formed of the spacers 315 and 319, and the oxide layers 115 and 117, to do so. A tunnel dielectric layer 331 is then grown over that newly exposed polysilicon edge. The spacer 317 remains a distance away from that floating gate edge but does not interfere with subsequently forming the erase gate in that space 307.

A next step is to fill in the spaces between the rows with doped polysilicon in order to form erase gates 335, 337 and 339, illustrated in FIG. 6. This is done by depositing a third polysilicon layer over the structure with a thickness sufficient to fill in the spaces between the rows, this thickness generally being about 3000 Angstroms. This layer is then separated into its elongated erase gates 335, 337 and 339 by appropriate photoresist masking and etching steps. The result is that the erase gate 337, for example, is coupled through the tunnel dielectric layer 331 with the floating gate 301 but is maintained a sufficient distance from the opposite floating gate 303 by the spacer 314 to result in only an insignificant coupling with this opposite floating gate. Thus, the erase gate 337, elongated in a direction into the paper, is coupled with the floating gates of a row of memory cells that is elongated in a direction into the paper behind the floating gate 301, without being coupled with the adjacent row that is elongated in a direction into the paper behind the floating gate 303. Each erase gate of the array is so positioned and coupled with a single row of memory cells.

This result is obtained without having to increase the size of the memory cells. By the method described above, a significant degree of misalignment of the mask used to form the photoresist masking strips 305 and 309 (FIG. 3) can be tolerated with respect to other elements. There is a wide latitude that is acceptable for the width of the resulting spaces 307 and 311. These spaces should be wide enough to allow formation of the respective spacers 319 and 325 (FIG. 4) with thicknesses sufficient to isolate the resulting erase gates 337 and 339 (FIG. 6) from respective floating gates 303 and 305. Yet, these spaces should not be so wide that their is no extension of the floating gates into the spaces beyond the thickness of the spacers above them. Otherwise, it becomes more difficult to obtain the exposed floating gate edges upon which the tunnel dielectric layers are formed.

Second Embodiment

A second way of obtaining a separate erase gate for each row of memory cells is illustrated by the cross-sectional views of FIGS. 7–9. Referring first to FIG. 7, the structure of FIG. 2 has sidewall spacers 341, 343, 345 and 347 formed by the same CVD thick oxide deposition and anisotropic etch technique described above. This then forms a mask that is used to etch away portions of the first doped polysilicon layer strips, such as the strip 77, in order to separate them into individual floating gates, such as floating gates 349, 351 and 353. This leaves exposed edge surfaces of the floating gates, and a next step forms thin layers of tunnel dielectric on them, such as layers 355, 357, 359, and 361.

The resulting intermediate structure of FIG. 7 is similar to that shown in FIGS. 13A–C of the earlier application before the erase gates are there formed in the spaces between the rows. But instead of depositing the third doped polysilicon layer thick enough to completely fill the spaces between the rows, as is done in the earlier application, a much thinner layer 363 (FIG. 8) of polysilicon if formed. The thickness of the layer 363 is preferably made to be less than that which causes the portions of the layer 363 which conform to the sides of the spacers and tunnel dielectric layers to be joined together at the bottom of the spaces. This is so that a subsequent anisotropic etching step will, with assurance, remove the polysilicon layer for a distance across the bottom of the space in order to form electrically separate erase gates along the sidewalls of each row of the array. Thus, the exact thickness of the layer 363 depends upon the geometry of the structure upon which the layer 363 is formed, but may typically be a few hundred Angstroms.

FIG. 9 shows the result of such an anisotropic etch of the polysilicon layer 363. The etching step removes the layer 363 from the horizontal surfaces on top of the oxide layers 115, 117 and 119, and from the bottom of the spaces between the rows. The result is a pair of erase gates for each row, such as the erase gates 367 and 369, which are elongated in a direction into the paper, on opposite sides of a row of memory cells that includes a cell having the floating gate 351. The erase gates 367 and 369 are both coupled with the floating gate 351 through respective tunnel dielectric layers 357 and 359. Separate erase gates are thus easily formed for each row of memory cells by a self-aligned technique that does not require the individual memory cells to be made larger than those of the earlier application.

The inherent result of forming erase gate layers on both sides of each row has certain advantages. One such advantage is that the coupling area between the erase gate and each floating gate is twice that of a structure that has an erase gate on only one side of each row. In order to realize this advantage, the erase gates 367 and 369 of an exemplary row are joined together at least one end of the row by a bridging area of conductive polysilicon 375 (FIG. 10). The same is done for every other row.

Another advantage of the structure of FIGS. 9 and 10 is that the erase gates of one row electrically shield that row from effects of the erase gates and other elements in adjacent rows. This provides a higher degree of isolation of the rows from one another.

Although the various aspects of the present invention have been described with respect to its preferred embodiments, it will be understood that the invention is entitled to protection within the full scope of the appended claims.

It is claimed:

1. In a flash EEPROM formed on a semiconductor substrate with a plurality of adjacent rows of memory cells, individual ones of said rows comprising:

a plurality of floating gates, one floating gate per memory cell, having two opposing side walls, an elongated control gate having its length extending along the row in a position over the floating gates in a manner to establish a capacitive coupling therebetween, and at least one elongated erase gate having its length extending along one side of the row in a manner to establish a capacitive coupling with the floating gates thereof through a tunnel dielectric therebetween, wherein said tunnel dielectric is provided on one of said two floating gate side walls; a spacer is provided on another of said two floating gate side walls; and said spacer isolates said another floating gate side wall from an erase gate of an immediately adjacent one of said rows.

2. In a flash EEPROM formed on a semiconductor substrate with a plurality of adjacent rows of memory cells, individual ones of said rows comprising:

a plurality of floating gates, one floating gate per memory cell, an elongated control gate having its length extending along the row in a position over the floating gates in a manner to establish a capacitive coupling therebetween, and at least one elongated erase gate having its length extending along one side of the row in a manner to establish a capacitive coupling with the floating gates thereof through a tunnel dielectric therebetween and spaced apart from an immediately adjacent one of the plurality of rows in order not to establish such a capacitive coupling with the floating gates of said adjacent row;

wherein said at least one elongated erase gate includes an elongated erase gate extending along each of opposing sides of the individual rows of memory cells, thereby providing individual rows with two erase gates each, the two erase gates for the individual rows being joined together at an end of the respective rows.

3. In a flash EEPROM formed on a semiconductor substrate with a plurality of adjacent rows of memory cells, individual ones of said rows comprising:

a plurality of floating gates, one floating gate per memory cell, having a first and a second opposing side walls, an elongated control gate having its length extending along the row in a position over the floating gates in a manner to establish a capacitive coupling therebetween, and a first and a second elongated erase gates having their lengths extending along opposite sides of the row in a manner to establish a capacitive coupling with the first and the second floating gate side walls through a layer of tunnel dielectric therebetween and spaced apart from an immediately adjacent one of the plurality of rows in order not to establish such a capacitive coupling with the floating gates of said adjacent row.

* * * * *